United States Patent
Hosaka et al.

(10) Patent No.: US 12,445,118 B2
(45) Date of Patent: Oct. 14, 2025

(54) ARBITRARY WAVEFORM GENERATION APPARATUS AND ARBITRARY WAVEFORM GENERATION METHOD

(71) Applicant: ANRITSU CORPORATION, Kanagawa (JP)

(72) Inventors: Yasuo Hosaka, Kanagawa (JP); Tatsuya Iwai, Kanagawa (JP)

(73) Assignee: ANRITSU CORPORATION, Kanagawa (JP)

(*) Notice: Subject to any disclaimer, the term of this patent is extended or adjusted under 35 U.S.C. 154(b) by 45 days.

(21) Appl. No.: 18/416,161

(22) Filed: Jan. 18, 2024

(65) Prior Publication Data
US 2024/0322803 A1 Sep. 26, 2024

(30) Foreign Application Priority Data
Mar. 20, 2023 (JP) .................. 2023-044445

(51) Int. Cl.
*H03K 5/01* (2006.01)
*H03M 1/66* (2006.01)

(52) U.S. Cl.
CPC ............... *H03K 5/01* (2013.01); *H03M 1/66* (2013.01)

(58) Field of Classification Search
CPC .................. H03K 5/01; H03M 1/66
See application file for complete search history.

(56) References Cited

U.S. PATENT DOCUMENTS

| | | | | |
|---|---|---|---|---|
| 6,232,759 B1* | 5/2001 | Wohlfarth | ........ | G01R 31/31924 714/724 |
| 6,654,916 B1* | 11/2003 | Furukawa | ............. | H03K 4/02 714/724 |
| 7,952,396 B1* | 5/2011 | Hunter | ............ | G06F 1/0321 327/106 |
| 11,146,280 B2* | 10/2021 | Martin | ............ | G06F 1/0321 |

FOREIGN PATENT DOCUMENTS

JP H08-7643 B2 1/1996

* cited by examiner

*Primary Examiner* — Sibin Chen
(74) *Attorney, Agent, or Firm* — McDonald Hopkins LLC

(57) ABSTRACT

There are provided a waveform memory 10 that stores waveform data of an arbitrary waveform, a control unit 30 that outputs the waveform data stored in the waveform memory in time-series order at predetermined time intervals, and a waveform signal generation unit 20 that generates a waveform signal by performing digital-analog conversion on the waveform data output under the control of the control unit. A data processing unit 40 that sequentially calculates, when generating a pulse pattern waveform, waveform data in time-series order based on pulse pattern data is further provided, and the control unit outputs the sequentially calculated waveform data at predetermined time intervals from the data processing unit to the waveform signal generation unit, and causes the waveform signal generation unit to generate a waveform signal by performing digital-analog conversion.

10 Claims, 7 Drawing Sheets

ARBITRARY WAVEFORM GENERATION APPARATUS AND ARBITRARY WAVEFORM GENERATION METHOD

TECHNICAL FIELD

The present invention relates to an arbitrary waveform generation apparatus and an arbitrary waveform generation method.

BACKGROUND ART

In the related art, performance of a device under test is evaluated by inputting a known test signal to the device under test and measuring an output signal from the device under test. As a device for generating the test signal, an arbitrary waveform generation apparatus that can generate an arbitrary waveform signal is used (see, for example, Patent Document 1).

FIG. 7 is a diagram illustrating a schematic configuration of an arbitrary waveform generation apparatus in the related art, disclosed in Patent Document 1. As illustrated in FIG. 7, an arbitrary waveform generation apparatus 100 in the related art includes a waveform memory 110 that stores waveform data 111, a waveform signal generation unit 120 that includes a digital-analog converter, and a control unit 130 that controls reading of the waveform data from the waveform memory 110. The arbitrary waveform generation apparatus 100 sequentially reads the waveform data 111 from the waveform memory 110 under the control of the control unit 130, and converts the digital waveform data into an analog signal by the digital-analog converter of the waveform signal generation unit 120 to output an arbitrary waveform signal.

RELATED ART DOCUMENT

Patent Document

[Patent Document 1] JP-B-H8-7643

DISCLOSURE OF THE INVENTION

Problem that the Invention is to Solve

Meanwhile, in the arbitrary waveform generation apparatus described in Patent Document 1, all waveform data is stored in the waveform memory in advance, in a case where a pseudo random signal consisting of a very long data string such as pseudo random bit sequence (PRBS) 31 is output, there is a problem in that a huge capacity of the waveform memory is required. In addition, in a case of outputting a digital signal using a non return to zero (NRZ) method, a plurality of bits are required to specify a resolution of the digital-analog converter for one bit representing high/low (H/L). Meanwhile, there is a problem in that the waveform memory larger than necessary is required.

The present invention is made to solve such problems, and an object of the present invention is to provide an arbitrary waveform generation apparatus and an arbitrary waveform generation method capable of generating even a signal with a long pulse pattern such as a pseudo random signal or an NRZ-type digital signal, without requiring a large-capacity waveform memory.

Means for Solving the Problem

According to the present invention, there is provided an arbitrary waveform generation apparatus including: a waveform memory (10) that stores waveform data, which is time-series data of an arbitrary waveform; a control unit (30) that performs control of outputting the waveform data stored in the waveform memory in time-series order at predetermined time intervals; a waveform signal generation unit (20) that generates a waveform signal by performing digital-analog conversion on the waveform data output under the control of the control unit; and a data processing unit (40) that sequentially calculates the waveform data in time-series order based on pulse pattern data, which is time-series data of a pulse pattern, when generating a pulse pattern waveform, in which the control unit outputs the sequentially calculated waveform data from the data processing unit to the waveform signal generation unit at the predetermined time intervals, and causes the waveform signal generation unit to generate a waveform signal by performing digital-analog conversion.

As described above, in the arbitrary waveform generation apparatus according to the present invention, when generating a pulse pattern waveform, the data processing unit sequentially calculates waveform data in time-series order based on pulse pattern data that is time-series data of a pulse pattern, and the control unit outputs the sequentially calculated waveform data from the data processing unit to the waveform signal generation unit at predetermined time intervals, and causes the waveform signal generation unit to generate a waveform signal by performing digital-analog conversion. With this configuration, there is no need to store all the data in the waveform memory in advance, and it is possible to generate even a waveform signal with a long pulse pattern such as a pseudo random signal or an NRZ-type digital signal, without requiring a large-capacity waveform memory.

Further, in the arbitrary waveform generation apparatus according to the present invention, the data processing unit may sequentially calculate the pulse pattern data based on a generation polynomial corresponding to a designated pseudo random bit sequence, and may sequentially calculate the waveform data based on the sequentially calculated pulse pattern data.

With this configuration, the arbitrary waveform generation apparatus according to the present invention can generate even a waveform signal with a long pulse pattern, such as a pseudo random signal, without requiring a large-capacity waveform memory.

Further, in the arbitrary waveform generation apparatus according to the present invention, the data processing unit may sequentially calculate the pulse pattern data based on a generation polynomial corresponding to a designated pseudo random bit sequence, may sequentially calculate pulse pattern encoding data by encoding the sequentially calculated pulse pattern data by using a designated encoding method, and may sequentially calculate the waveform data based on the sequentially calculated pulse pattern encoding data.

With this configuration, the arbitrary waveform generation apparatus according to the present invention can generate even a waveform signal obtained by encoding a pseudo random signal without requiring a large-capacity waveform memory.

Further, in the arbitrary waveform generation apparatus according to the present invention, the waveform memory may store the pulse pattern data, the control unit may perform control of outputting the pulse pattern data stored in the waveform memory to the data processing unit in time-series order, and the data processing unit may sequentially calculate the waveform data in time-series order based on the pulse pattern data output from the waveform memory under the control of the control unit.

With this configuration, the arbitrary waveform generation apparatus according to the present invention can generate even a signal with an arbitrary pulse pattern, such as an NRZ-type digital signal, without requiring a large-capacity waveform memory.

Further, in the arbitrary waveform generation apparatus according to the present invention, the waveform memory may store the pulse pattern data, the control unit may perform control of outputting the pulse pattern data stored in the waveform memory to the data processing unit in time-series order, and the data processing unit may sequentially calculate pulse pattern encoding data by encoding the pulse pattern data output from the waveform memory under the control of the control unit by using a designated encoding method, and may sequentially calculate the waveform data based on the sequentially calculated pulse pattern encoding data.

With this configuration, the arbitrary waveform generation apparatus according to the present invention can generate even a waveform signal obtained by encoding pulse pattern data without requiring a large-capacity waveform memory.

According to the present invention, there is provided an arbitrary waveform generation method including: a step of storing waveform data, which is time-series data of an arbitrary waveform, in a waveform memory; a control step of performing control of outputting the waveform data stored in the waveform memory to a digital-analog converter at predetermined time intervals in time-series order; a waveform signal generation step of generating a waveform signal by performing digital-analog conversion on the waveform data output under the control in the control step, by the digital-analog converter; a data processing step of sequentially calculating the waveform data in time-series order based on pulse pattern data, which is time-series data of a pulse pattern, when generating a pulse pattern waveform; and a step of performing control of outputting the sequentially calculated waveform data to the digital-analog converter at the predetermined time intervals and generating a waveform signal by digital-analog conversion.

As described above, the arbitrary waveform generation method of the present invention includes the step of sequentially calculating, when generating a pulse pattern waveform, waveform data in time-series order based on pulse pattern data that is time-series data of a pulse pattern, and performing control of outputting the sequentially calculated waveform data to the digital-analog converter at the predetermined time intervals and generating a waveform signal by digital-analog conversion. With this configuration, there is no need to store all the data in the waveform memory in advance, and it is possible to generate even a waveform signal with a long pulse pattern such as a pseudo random signal or an NRZ-type digital signal, without requiring a large-capacity waveform memory.

Further, in the arbitrary waveform generation method according to the present invention, in the data processing step, the pulse pattern data may be sequentially calculated based on a generation polynomial corresponding to a designated pseudo random bit sequence, and the waveform data may be sequentially calculated based on the sequentially calculated pulse pattern data.

Further, in the arbitrary waveform generation method according to the present invention, in the data processing step, the pulse pattern data may be sequentially calculated based on a generation polynomial corresponding to a designated pseudo random bit sequence, pulse pattern encoding data may be sequentially calculated by encoding the sequentially calculated pulse pattern data by using a designated encoding method, and the waveform data may be sequentially calculated based on the sequentially calculated pulse pattern encoding data.

Further, in the arbitrary waveform generation method according to the present invention, the waveform memory may store the pulse pattern data, control of outputting the pulse pattern data stored in the waveform memory to the data processing unit in time-series order may be performed, and the waveform data may be sequentially calculated in time-series order based on the pulse pattern data output from the waveform memory.

Further, in the arbitrary waveform generation method according to the present invention, the waveform memory may store the pulse pattern data, the pulse pattern data stored in the waveform memory may be output in time-series order, and pulse pattern encoding data may be sequentially calculated by encoding the pulse pattern data output from the waveform memory by using a designated encoding method, and the waveform data may be sequentially calculated based on the sequentially calculated pulse pattern encoding data.

Advantage of the Invention

According to the present invention, there is provided an arbitrary waveform generation apparatus and an arbitrary waveform generation method capable of generating even a signal with a long pulse pattern such as a pseudo random signal or an NRZ-type digital signal, without requiring a large-capacity waveform memory.

BEST MODE FOR CARRYING OUT THE INVENTION

Hereinafter, embodiments of the present invention will be described with reference to the drawings.

Figure 1:
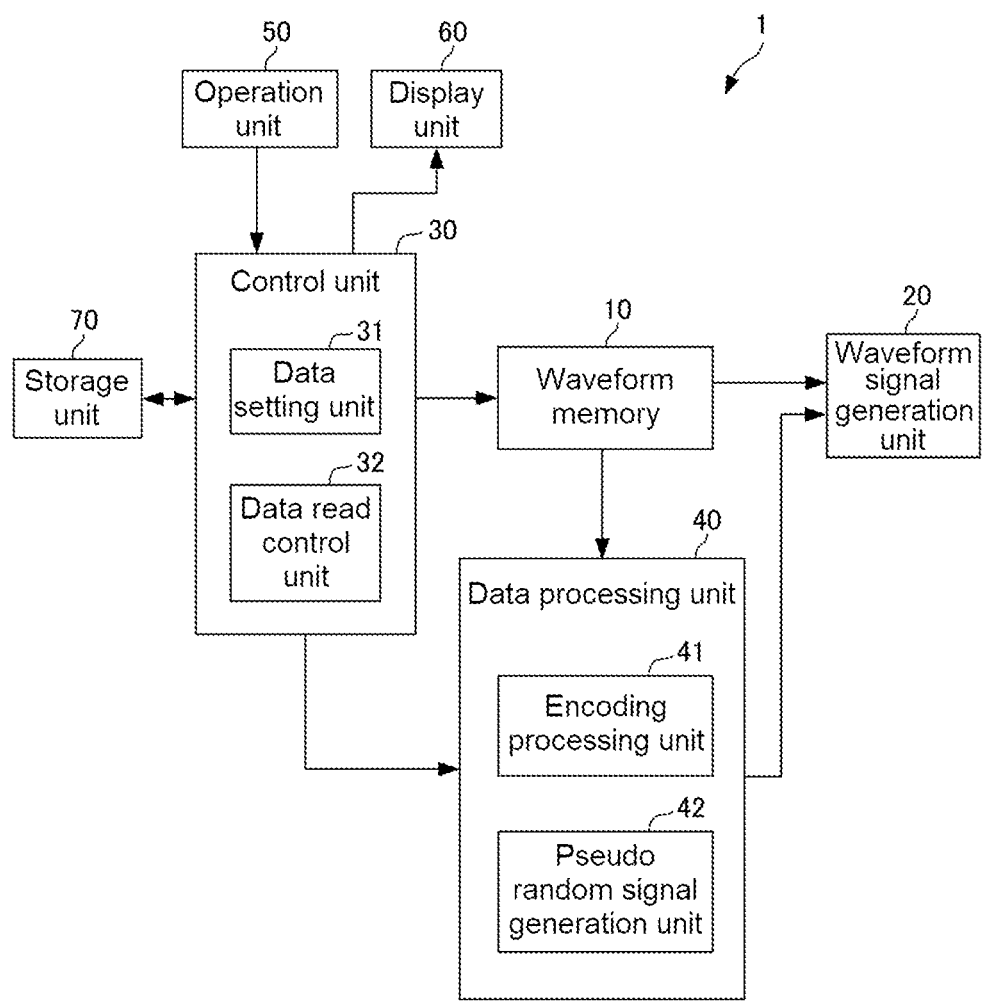
FIG. 1 is a diagram illustrating a schematic configuration of an arbitrary waveform generation apparatus according to an embodiment of the present invention.

FIG. 1 is a diagram illustrating a schematic configuration of an arbitrary waveform generation apparatus 1 according to the present embodiment. As illustrated in FIG. 1, the arbitrary waveform generation apparatus 1 includes a waveform memory 10, a waveform signal generation unit 20, a control unit 30, a data processing unit 40, an operation unit 50, a display unit 60, and a storage unit 70.

(Waveform Memory)

The waveform memory 10 stores "waveform data" which is time-series data of an arbitrary waveform. Further, in a case where a waveform of a pulse pattern set by a user is generated, the waveform memory 10 stores "pulse pattern data" which is time-series data of the pulse pattern.

The waveform data includes, for example, data strings f(t1), f(t2), ..., and f(tN) of values of a waveform f(t) at times t1, t2, ..., and tN. In this case, the waveform memory 10 stores the waveform data f(t1), f(t2), ..., and f(tN) at predetermined addresses. Each piece of data in the data strings constituting the waveform data is sequentially read and provided to the waveform signal generation unit 20 to generate a waveform signal. That is, the waveform data is a data string with which the waveform signal generation unit 20 can generate a desired waveform signal.

The pulse pattern data includes, for example, pulse patterns B1, B2, ..., Bm, ..., and BM (where Bm is 0 or 1) The pulse pattern data includes pulse pattern data based on a pulse pattern set by the user and pulse pattern data generated from a PRBS designated by the user. In a case of the pulse pattern data based on the pulse pattern set by the user, the pulse pattern data B1, B2, ..., and BM are stored in the waveform memory 10. In either case, the pulse pattern data B1, B2, ..., and BM are sequentially generated or acquired, subjected to encoding processing designated by the user if necessary, and are sequentially converted into waveform data usable by the waveform signal generation unit 20.

(Waveform Signal Generation Unit)

The waveform signal generation unit 20 includes a digital-analog converter (also referred to as a D/A converter), and generates a waveform signal by performing digital-analog conversion on the waveform data output under output control of the control unit 30.

(Control Unit)

The control unit 30 includes a data setting unit 31 and a data read control unit 32.

The data setting unit 31 acquires waveform data or pulse pattern data stored in the storage unit 70 based on setting information (waveform, encoding method, PRBS, signal level, and the like) input by the user via the operation unit 50, and sets the waveform data or the pulse pattern data in the waveform memory 10. In addition, based on setting information on an encoding method input by the user via the operation unit 50, the data setting unit 31 sets the encoding method for causing the encoding processing unit 41 to execute encoding using the designated encoding method. Further, based on information specifying a pseudo random signal input by the user via the operation unit 50, the data setting unit 31 sets the pseudo random signal for causing the pseudo random signal generation unit 42 to use a generation polynomial corresponding to the pseudo random signal.

The data read control unit 32 performs output control to output the waveform data stored in the waveform memory 10 in time-series order at predetermined time intervals. The output waveform data is converted into an analog waveform signal by the waveform signal generation unit 20.

Further, when generating a pulse pattern waveform in a case where pulse pattern data is stored in the waveform memory 10, the data read control unit 32 performs output control for outputting the pulse pattern data stored in the waveform memory 10 to the data processing unit 40 in time-series order.

In addition, in a case of generating a pulse pattern waveform, the data read control unit 32 outputs waveform data sequentially calculated by the data processing unit 40 from the data processing unit 40 to the waveform signal generation unit 20 at predetermined time intervals, and causes the waveform signal generation unit 20 to generate a waveform signal by performing digital-analog conversion.

The control unit 30 is configured with, for example, a computer having a central processing unit (CPU), a storage device such as a read only memory (ROM), a random access memory (RAM), a hard disk drive (HDD), a solid state drive (SDD), and the like. The control unit 30 may be configured to control an operation of each unit constituting the arbitrary waveform generation apparatus 1. The control unit 30 can perform the control by reading a control program stored in the ROM or the storage device into the RAM and executing the control program by the CPU.

(Data Processing Unit)

The data processing unit 40 performs necessary data processing (encoding, signal level adjustment, or the like) based on pulse pattern data, which is time-series data of a pulse pattern, and sequentially calculates waveform data in time-series order. Therefore, the data processing unit 40 includes an encoding processing unit 41 and a pseudo random signal generation unit 42.

The pseudo random signal generation unit 42 sequentially calculates pulse pattern data (pseudo random bit sequence) based on a generation polynomial corresponding to a designated pseudo random bit sequence, and sequentially calculates waveform data based on the sequentially calculated pulse pattern data.

The encoding processing unit 41 encodes the pulse pattern data output from the waveform memory 10 under output control by the control unit 30 by using a designated encoding method and sequentially calculates pulse pattern encoding data, and sequentially calculates waveform data based on the sequentially calculated pulse pattern encoding data.

The encoding processing unit 41 may sequentially calculate waveform data in time-series order based on the pulse pattern data output from the waveform memory 10 under the output control of the control unit 30.

The data processing unit 40 may cause the pseudo random signal generation unit 42 to generate pulse pattern data (pseudo random bit sequence) based on the generation polynomial corresponding to the designated pseudo random bit sequence, cause the encoding processing unit 41 to encode the pulse pattern data by using a designated encoding method and to sequentially calculate pulse pattern encoding data, and sequentially calculate waveform data based on the sequentially calculated pulse pattern encoding data.

<Generation of Pseudo Random Signal>

The pseudo random signal generation unit 42 is configured with n shift registers connected in series, and an exclusive OR gate in which an exclusive OR of an output signal of a shift register at a final stage and an output signal of one or more intermediate shift registers determined by the number n of stages of the shift register is returned as a feedback signal to a shift register at a head. A period (pattern length) of the generated pseudo random signal is $2^n-1$. For example, in a case where the pseudo random signal is PRBS31, a generation polynomial is $1+X^{28}+X^{31}$, and a period is $2^{31}-1=2,147,483,647$ bits.

<Encoding>

The encoding method performed by the encoding processing unit 41 is, for example, an NRZ modulation method in which zero is not returned among each bit, a pulse amplitude modulation (PAM) method which is a method in which an amplitude is divided into four or more levels for each symbol, a quadrature amplitude modulation (QAM) method, which is a modulation method in which data is transmitted by changing and adjusting amplitudes of two mutually independent carrier waves, or the like. As a transmission method for handling PAM signals, for example, a PAM4 method for transmitting PAM4 signals, a PAM8 method for transmitting PAM8 signals, and the like are known. Among these, the PAM4 method is a method of using a pulse amplitude modulation (PAM) signal obtained by encoding an amplitude of an information signal with a series of pulse signals, and modulating and transmitting a bit string configured with logics "0" and "1" as a pulse signal of four voltage levels or optical power. For example, 16QAM is a method by which 16 values (4-bit data) can be transmitted at one time, among QAMs that are modulation methods for digital signals.

The data processing unit 40 can be configured with a digital circuit such as a field programmable gate array (FPGA) or an application specific integrated circuit (ASIC). Alternatively, depending on a processing speed, at least a part of the data processing unit 40 can be configured by appropriately combining hardware processing by a digital circuit and software processing by a predetermined program.

(Operation Unit)

The operation unit 50 is to accept an operation input of a user, and is configured with, for example, a touch panel that is provided at the display unit 60. Alternatively, the operation unit 50 may include an input device such as a keyboard or a mouse. In addition, the operation unit 50 may be configured with an external control apparatus which performs remote control by using a remote command or the like. The operation input to the operation unit 50 is detected by the control unit 30. For example, the user can use the operation unit 50 to set setting information on a waveform to be generated, an encoding method, a pseudo random signal, a signal level, and the like.

(Display Unit)

The display unit 60 is configured with, for example, a display device such as an LCD or a CRT, and performs a display on an operation target such as a button, a soft key, a pull-down menu, and a text box for setting various conditions for waveform signal generation according to the control signal output from the control unit 30.

<Arbitrary Waveform Generation Method>

Next, an arbitrary waveform generation method will be described.

Figure 6:
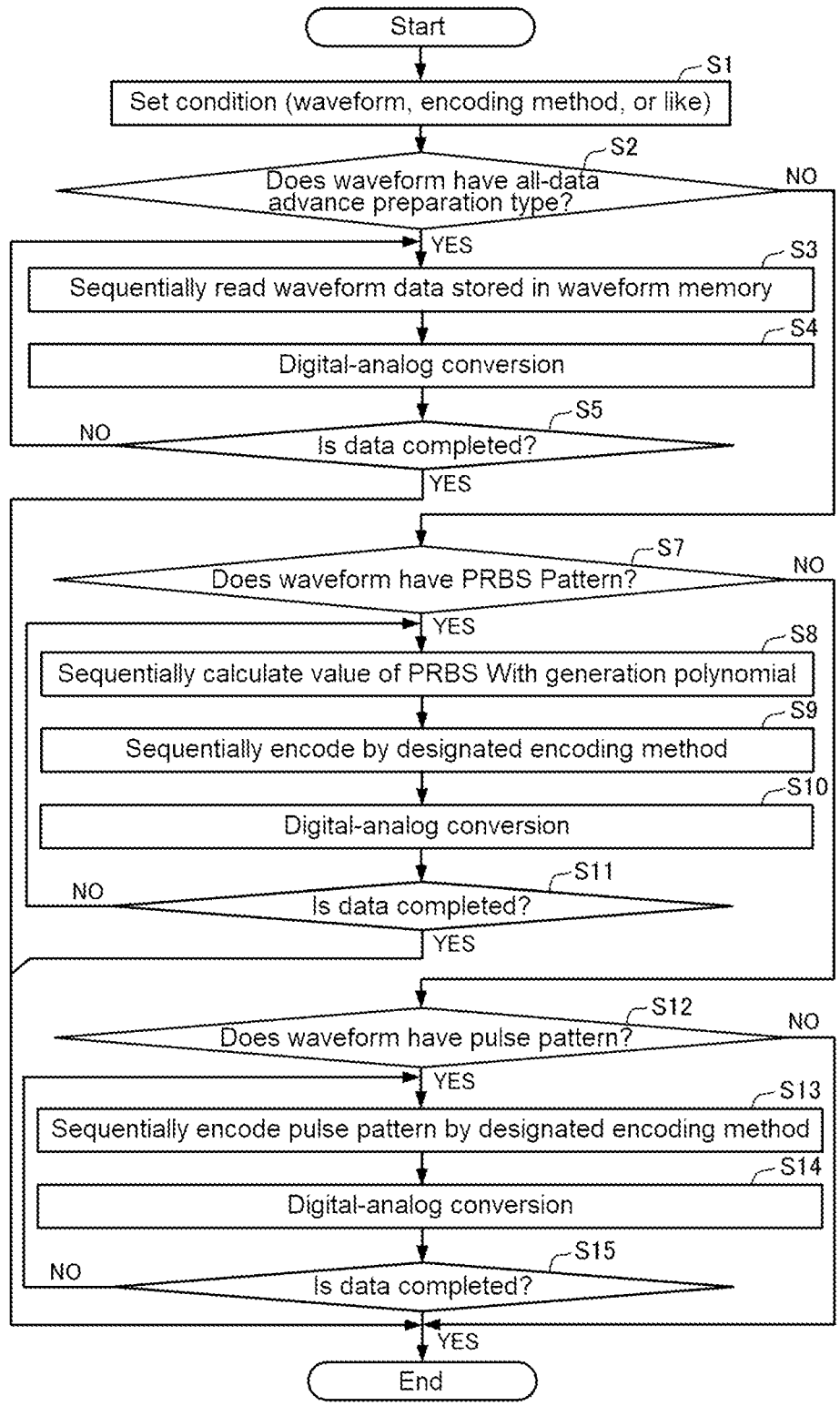
FIG. 6 is a diagram illustrating a flowchart of the arbitrary waveform generation method according to the embodiment of the present invention.
Figure 7:
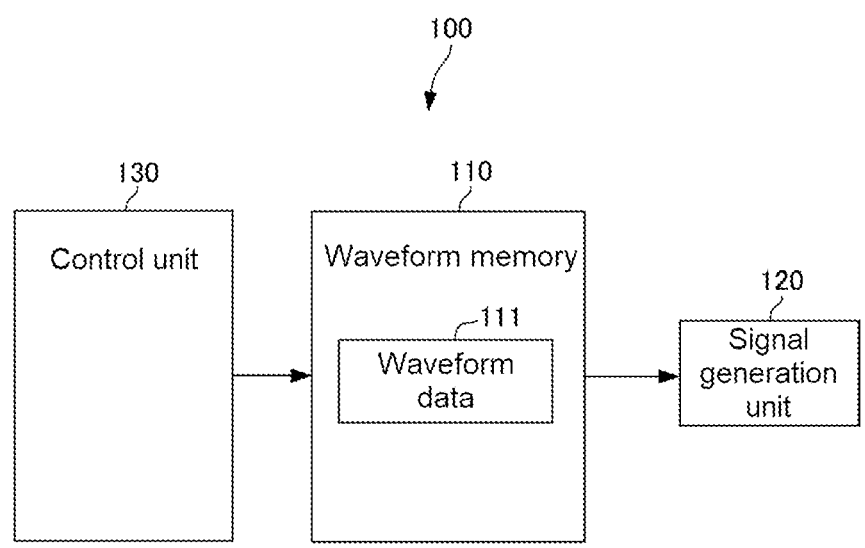
FIG. 7 is a diagram illustrating a schematic configuration of an arbitrary waveform generation apparatus in the related art.

FIG. 6 is a diagram illustrating a flowchart of an arbitrary waveform generation method according to the embodiment of the present invention.

As illustrated in FIG. 6, first, a user operates, for example, the operation unit 50 to set a condition such as a waveform, an encoding method, a pseudo random signal, and a signal level (step S1). The control unit 30 determines whether or not the waveform set by the user is an arbitrary waveform generator type waveform (that is, an all-data advance preparation type in which all data is prepared in advance) (S2), and in a case where the determination is negative (NO in step S2), the process proceeds to step S7. In a case where the determination is positive (YES in step S2), the data setting unit 31 of the control unit 30 stores the designated waveform data in the waveform memory 10. Next, the data read control unit 32 of the control unit 30 sequentially reads waveform data stored in the waveform memory 10 at predetermined time intervals (step S3). The waveform signal generation unit 20 converts the waveform data read from the waveform memory 10 into an analog waveform signal by digital-analog conversion (step S4). The control unit 30 determines whether or not all the waveform data is read (S5), and in a case where the determination is negative (NO in S5), the process is returned to step S3 and continued. In a case where the determination is positive (YES in S5), the process is ended.

In step S7, the control unit 30 determines whether or not the waveform set by the user has a PRBS pattern (S7), and in a case where the determination is negative (NO in step S7), the process proceeds to step S12. In a case where the determination is positive (YES in step S7), the data processing unit 40 sequentially calculates a value of a PRBS by using a generation polynomial corresponding to the designated PRBS (step S8). The data processing unit 40 sequentially encodes the sequentially calculated PRBS value by using a designated encoding method, and converts the resultant value into waveform data (step S9). The waveform signal generation unit 20 converts the waveform data corresponding to the PRBS values sequentially encoded by the data processing unit 40 into an analog waveform signal by digital-analog conversion (step S10). The control unit 30 determines whether or not all data of the PRBS pattern is completed (S11), and in a case where the determination is negative (NO in S11), the process is returned to step S8 and continued. In a case where the determination is positive (YES in S11), the process is ended.

In step S12, the control unit 30 determines whether or not the waveform set by the user has a pulse pattern (S12), and in a case where the determination is negative (NO in step S12), the process is ended. In a case where the determination is positive (YES in step S12), the data processing unit 40 acquires pulse pattern data stored in the waveform memory 10, and sequentially encodes the pulse pattern data by using the designated encoding method (step S13). The waveform signal generation unit 20 converts a value of the pulse pattern sequentially encoded by the data processing unit 40 into an analog waveform signal by digital-analog conversion (step S14). The control unit 30 determines whether or not all the data of the pulse pattern is completed (S15), and in a case where the determination is negative (NO in S15), the process is returned to step S13 and continued. In a case where the determination is positive (YES in S15), the process is ended.

Figure 2:
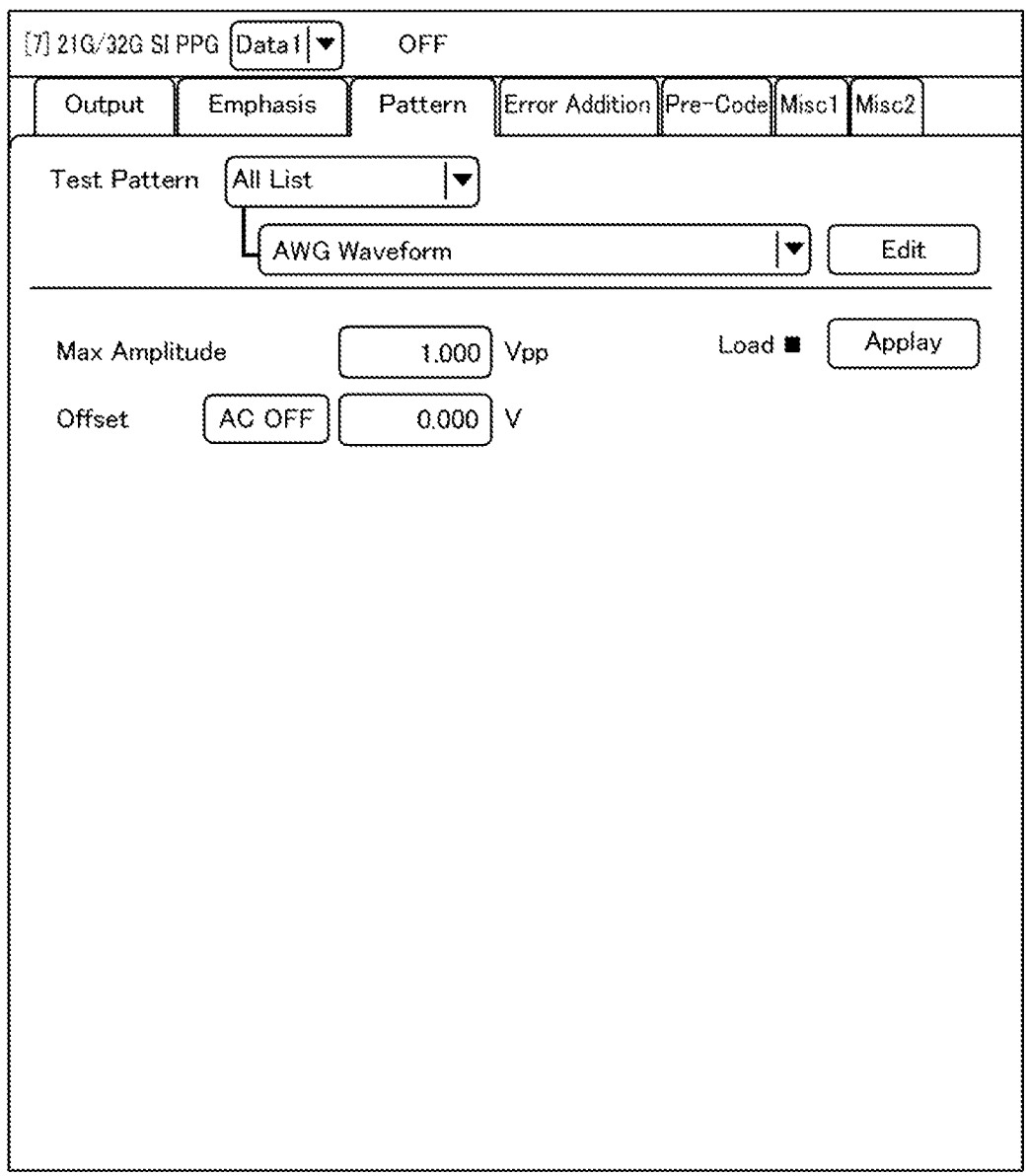
FIG. 2 is a diagram illustrating an example of a display screen of a display unit.

FIG. 2 illustrates an example of a screen in a case where an arbitrary waveform is output. If "AWG Waveform" is selected in an item of "Test Pattern", a waveform file can be selected, and waveform data included in the waveform file is stored in the waveform memory 10, and the waveform signal generation unit 20 can output a waveform signal. In FIG. 2, "Max Amplitude" and "Offset" can be set.

Figure 3:
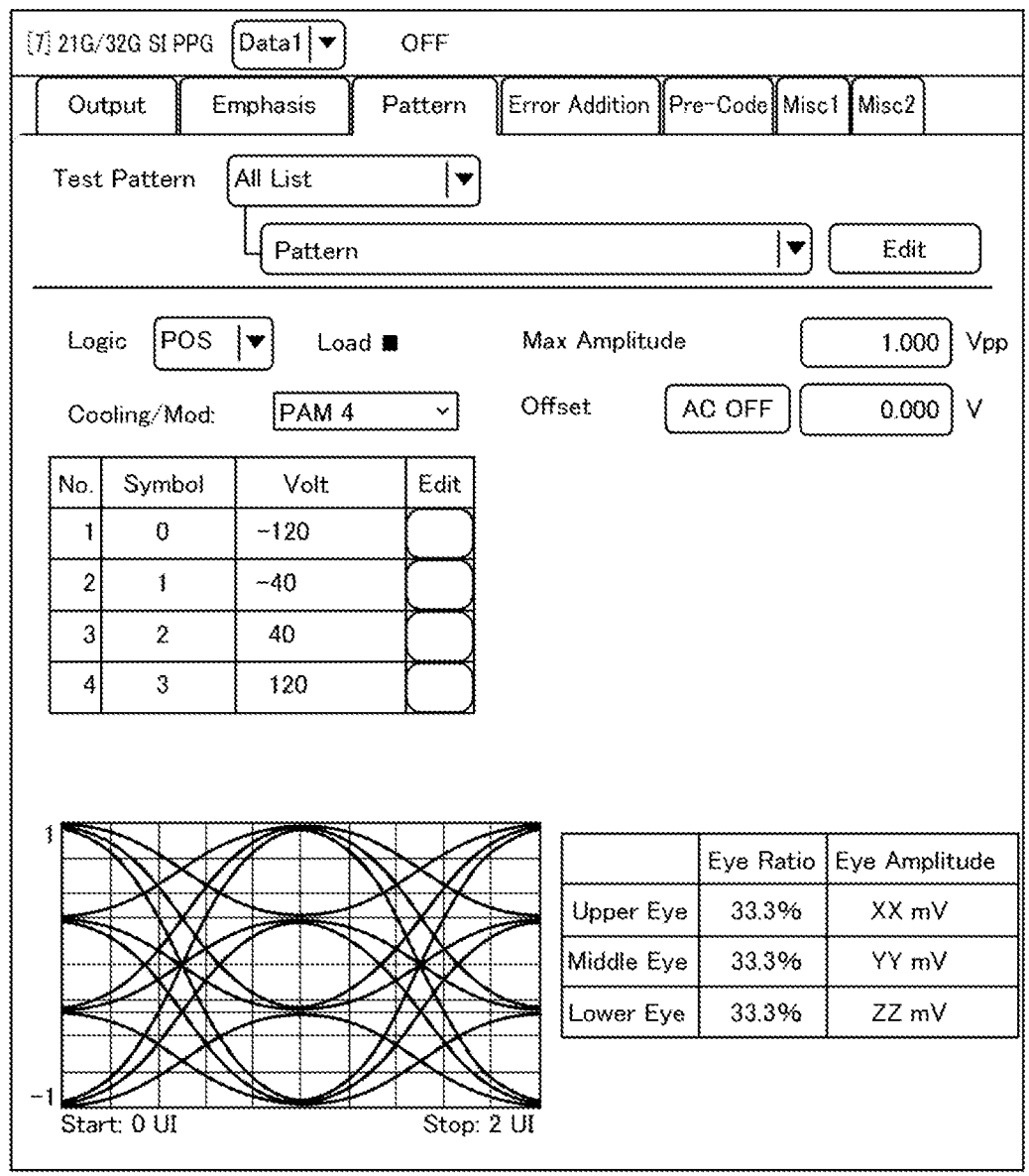
FIG. 3 is a diagram illustrating another example of the display screen of the display unit.

FIG. 3 illustrates an example of a screen in a case where a waveform signal is output based on pulse pattern data stored in the waveform memory 10. If "Pattern" is selected in an item of "Test Pattern", a pulse pattern data file can be selected, and an encoding method or an amplitude level can be set. In FIG. 3, PAM4 is selected as the encoding method. By editing "Symbol" and "Volt" in encoding, "Eye Ratio" and "Eye Amplitude" in an eye diagram can also be set.

Figure 4:
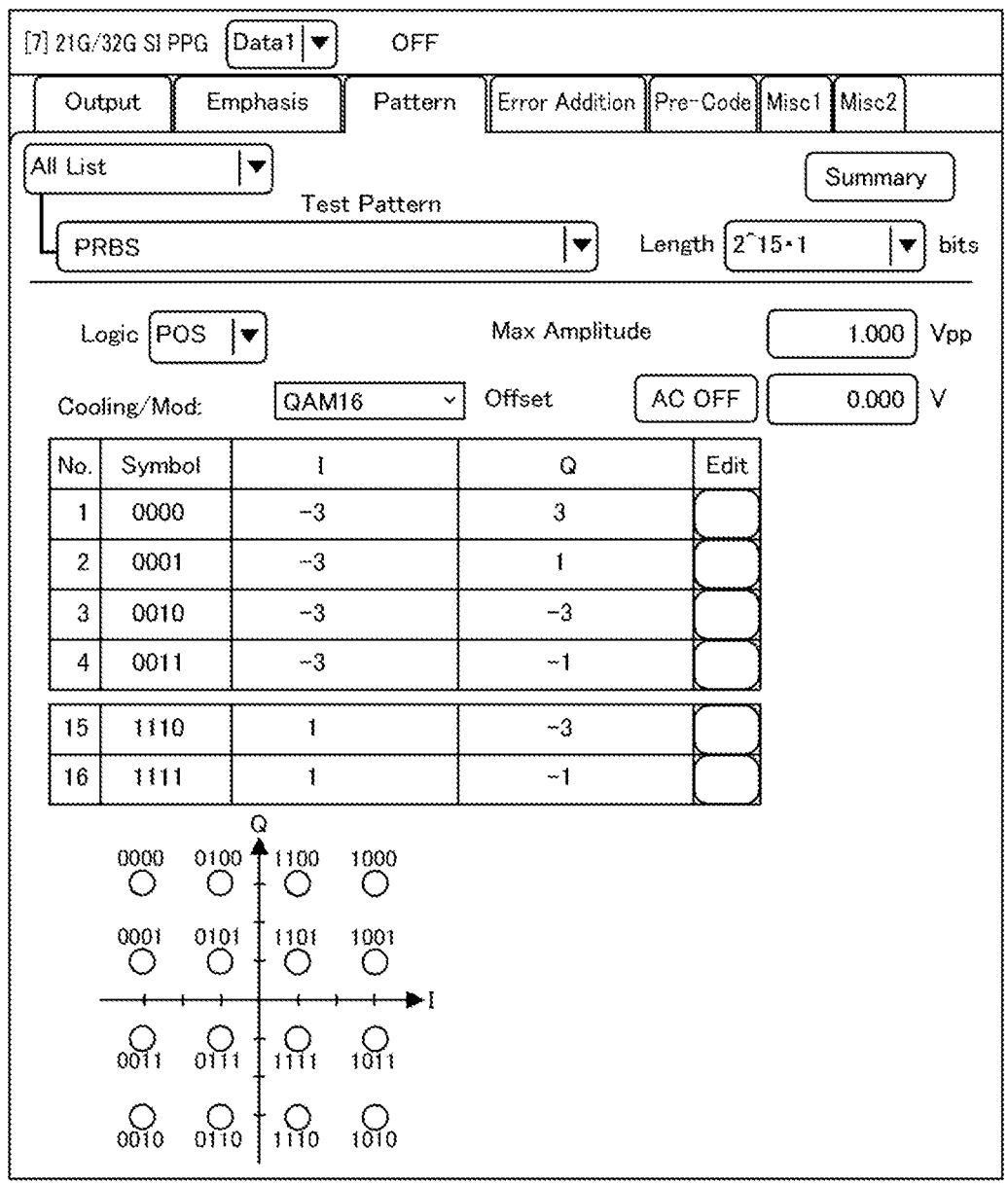
FIG. 4 is a diagram illustrating still another example of the display screen of the display unit.
Figure 5:
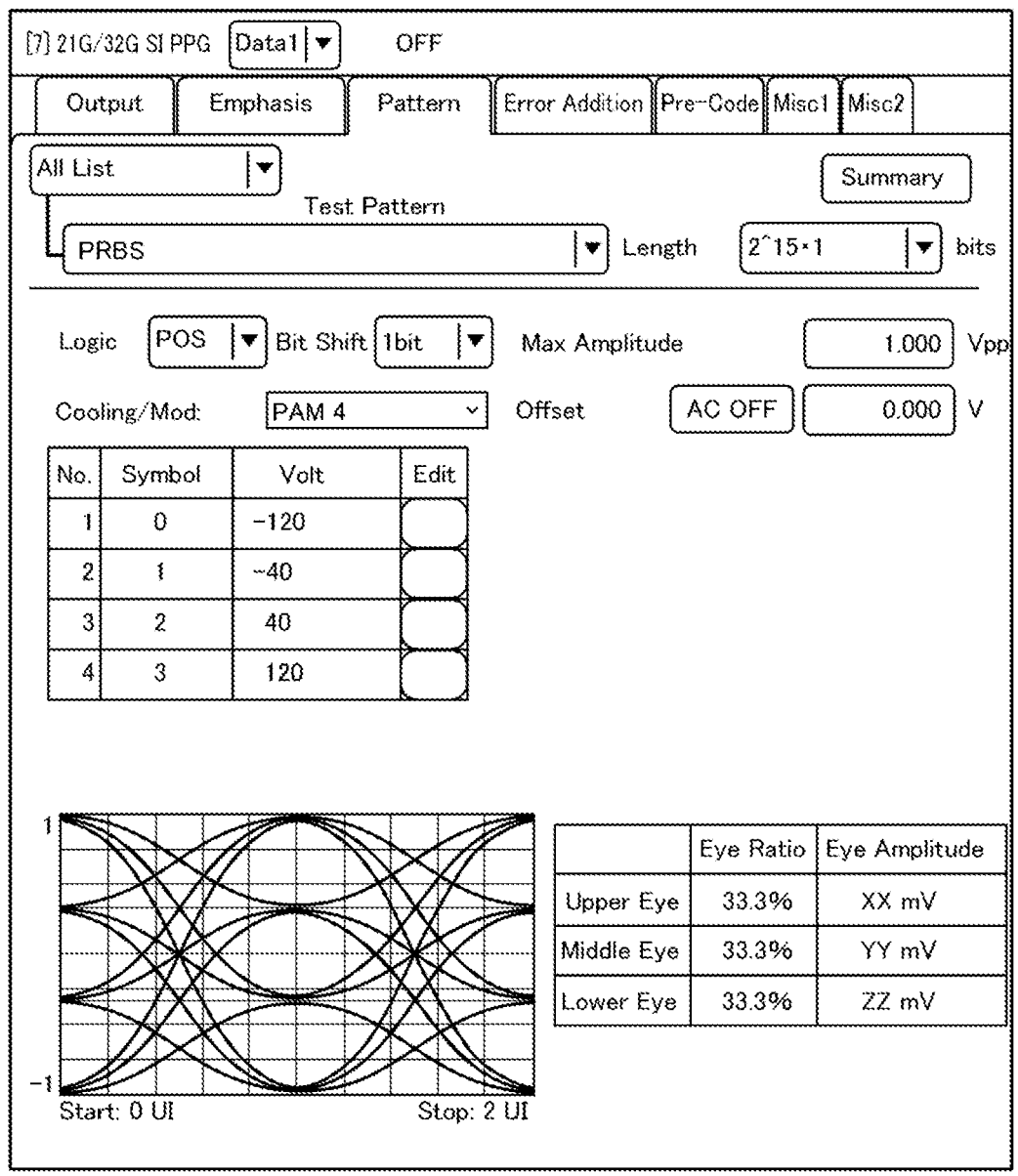
FIG. 5 is a diagram illustrating still another example of the display screen of the display unit.

FIGS. 4 and 5 illustrate examples of screens in a case where a PRBS pattern is output. If "PRBS" is selected in an item of "Test Pattern", a type, an encoding method, and an amplitude level of the PRBS can be set. In FIG. 4, QAM16 is selected as the encoding method, and in FIG. 5, PAM4 is selected as the encoding method.

Action and Effect

As described above, in the arbitrary waveform generation apparatus 1 according to the present embodiment, when generating a pulse pattern waveform, the data processing unit 40 executes data processing of sequentially calculating waveform data in time-series order based on pulse pattern data that is time-series data of a pulse pattern, and the control unit 30 outputs the sequentially calculated waveform data from the data processing unit 40 to the waveform signal generation unit at predetermined time intervals, and causes the waveform signal generation unit 20 to generate a waveform signal by performing digital-analog conversion. With this configuration, there is no need to store all the data in the waveform memory 10 in advance, and it is possible to generate even a signal with a long pulse pattern such as a pseudo random signal or an NRZ-type digital signal, without requiring a large-capacity waveform memory.

In addition, in the arbitrary waveform generation apparatus 1 according to the present embodiment, the data processing unit 40 sequentially calculates pulse pattern data (pseudo random bit sequence) based on a generation polynomial corresponding to a designated pseudo random bit sequence, and sequentially calculates waveform data based on the sequentially calculated pulse pattern data. Further, the data processing unit 40 may sequentially calculate pulse pattern data (pseudo random bit sequence) based on a generation polynomial corresponding to a designated pseudo random bit sequence, sequentially calculate pulse pattern encoding data by encoding the sequentially calculated pulse pattern data by using a designated encoding method, and sequentially calculate waveform data based on the sequentially calculated pulse pattern encoding data. With this configuration, the arbitrary waveform generation apparatus according to the present invention can generate even a signal with a long pulse pattern such as a pseudo random signal or a signal obtained by encoding the pseudo random signal, without requiring a large-capacity waveform memory.

Further, in the arbitrary waveform generation apparatus 1 according to the present embodiment, the waveform memory 10 stores pulse pattern data, the control unit 30 performs output control of outputting the pulse pattern data stored in the waveform memory 10 in time-series order, and the data processing unit 40 sequentially calculates waveform data in time-series order based on the pulse pattern data output from the waveform memory 10 under the output control of the control unit 30. Further, the data processing unit 40 may encode the pulse pattern data output from the waveform memory 10 under output control by the control unit 30 by using a designated encoding method and sequentially calculate pulse pattern encoding data, and sequentially calculate waveform data based on the sequentially calculated pulse pattern encoding data. With this configuration, it is possible to generate a signal, which is even an arbitrary pulse pattern signal such as an NRZ-type digital signal or a signal obtained by encoding the pulse pattern signal, without requiring a large-capacity waveform memory.

INDUSTRIAL APPLICABILITY

As described above, the present invention has the effect that even a signal with a long pulse pattern such as a pseudo random signal or an NRZ-type digital signal can be generated without requiring a large-capacity waveform memory, and is useful for an arbitrary waveform generation apparatus and an arbitrary waveform generation method in general.

DESCRIPTION OF REFERENCE NUMERALS AND SIGNS

1 Arbitrary waveform generation apparatus
10 Waveform memory
20 Waveform signal generation unit
30 Control unit
31 Data setting unit
32 Data read control unit
40 Data processing unit
41 Encoding processing unit
42 Pseudo random signal generation unit
50 Operation unit
60 Display unit
70 Storage unit

What is claimed is:

1. An arbitrary waveform generation apparatus comprising:
a waveform memory that stores waveform data, which is time-series data of an arbitrary waveform;
a control unit that performs control of outputting the waveform data stored in the waveform memory in time-series order at predetermined time intervals;
a waveform signal generation unit that generates a waveform signal by performing digital-analog conversion on the waveform data output under the control of the control unit; and
a data processing unit that sequentially calculates the waveform data in time-series order based on pulse pattern data, which is time-series data of a pulse pattern, when generating a pulse pattern waveform,
wherein the control unit controls the output of the sequentially calculated waveform data from the data processing unit to the waveform signal generation unit at the predetermined time intervals, and causes the waveform signal generation unit to generate a waveform signal by performing digital-analog conversion, and
wherein the data processing unit comprises a pseudo random signal generator configured to generate the pulse pattern data.

2. The arbitrary waveform generation apparatus according to claim 1,
wherein the data processing unit sequentially calculates the pulse pattern data based on a generation polynomial corresponding to a designated pseudo random bit sequence, and sequentially calculates the waveform data based on the sequentially calculated pulse pattern data.

3. The arbitrary waveform generation apparatus according to claim 1,
wherein the data processing unit sequentially calculates the pulse pattern data based on a generation polynomial corresponding to a designated pseudo random bit sequence, sequentially calculates pulse pattern encoding data by encoding the sequentially calculated pulse pattern data by using a designated encoding method, and sequentially calculates the waveform data based on the sequentially calculated pulse pattern encoding data.

4. The arbitrary waveform generation apparatus according to claim 1,
wherein the waveform memory stores the pulse pattern data,
the control unit performs control of outputting the pulse pattern data stored in the waveform memory to the data processing unit in time-series order, and
the data processing unit sequentially calculates the waveform data in time-series order based on the pulse pattern data output from the waveform memory under the control of the control unit.

5. The arbitrary waveform generation apparatus according to claim 1,
wherein the waveform memory stores the pulse pattern data,
the control unit performs control of outputting the pulse pattern data stored in the waveform memory to the data processing unit in time-series order, and
the data processing unit sequentially calculates pulse pattern encoding data by encoding the pulse pattern data output from the waveform memory under the control of the control unit by using a designated encoding method, and sequentially calculates the waveform data based on the sequentially calculated pulse pattern encoding data.

6. An arbitrary waveform generation method comprising:
a step of storing waveform data, which is time-series data of an arbitrary waveform, in a waveform memory;
a control step of performing control of outputting the waveform data stored in the waveform memory to a digital-analog converter at predetermined time intervals in time-series order;
a waveform signal generation step of generating a waveform signal by performing digital-analog conversion on the waveform data output under the control in the control step, by the digital-analog converter;
a pulse pattern data generation step of generating the pulse pattern data using a pseudo random signal generator;
a data processing step of sequentially calculating the waveform data in time-series order based on pulse pattern data, which is time-series data of a pulse pattern, when generating a pulse pattern waveform; and
a step of performing control of outputting the sequentially calculated waveform data to the digital-analog converter at the predetermined time intervals and generating a waveform signal by digital-analog conversion.

7. The arbitrary waveform generation method according to claim 6,
wherein in the data processing step, the pulse pattern data is sequentially calculated based on a generation polynomial corresponding to a designated pseudo random bit sequence, and the waveform data is sequentially calculated based on the sequentially calculated pulse pattern data.

8. The arbitrary waveform generation method according to claim 6,
wherein in the data processing step, the pulse pattern data is sequentially calculated based on a generation polynomial corresponding to a designated pseudo random bit sequence, pulse pattern encoding data is sequentially calculated by encoding the sequentially calculated pulse pattern data by using a designated encoding method, and the waveform data is sequentially calculated based on the sequentially calculated pulse pattern encoding data.

9. The arbitrary waveform generation method according to claim 6,
wherein the waveform memory stores the pulse pattern data,
control of outputting the pulse pattern data stored in the waveform memory to the data processing unit in time-series order is performed, and
the waveform data is sequentially calculated in time-series order based on the pulse pattern data output from the waveform memory.

10. The arbitrary waveform generation method according to claim 6,
wherein the waveform memory stores the pulse pattern data,
the pulse pattern data stored in the waveform memory is output in time-series order, and
pulse pattern encoding data is sequentially calculated by encoding the pulse pattern data output from the waveform memory by using a designated encoding method, and the waveform data is sequentially calculated based on the sequentially calculated pulse pattern encoding data.

* * * * *